United States Patent [19]

Kawada et al.

[11] Patent Number: 5,040,018
[45] Date of Patent: Aug. 13, 1991

[54] METHOD OF DISPOSING OF END OF PHOTOSENSITIVE MEDIUM

[75] Inventors: Ken Kawada; Minoru Ishikawa, both of Kanagawa, Japan

[73] Assignee: Fuji Photo Film Co., Ltd., Kanagawa, Japan

[21] Appl. No.: 88,360

[22] Filed: Aug. 24, 1987

[30] Foreign Application Priority Data

Aug. 28, 1986 [JP] Japan .................. 61-202350
Aug. 28, 1986 [JP] Japan .................. 61-202351
Aug. 28, 1986 [JP] Japan .................. 61-202352

[51] Int. Cl.⁵ .............................. G03B 29/00
[52] U.S. Cl. ........................... 355/28; 355/29
[58] Field of Search ..................... 355/28, 29

[56] References Cited

U.S. PATENT DOCUMENTS 3,591,279 7/1971 Gardner et al. ................. 355/29
4,417,808 11/1983 Kogane ......................... 355/29

Primary Examiner—Monroe H. Hayes
Attorney, Agent, or Firm—Sughrue, Mion, Zinn, Macpeak and Seas

[57] ABSTRACT

A method of disposing of the leading end of a roll of photosensitive medium in which a leading end portion of the photosensitive medium that gets fogged due to exposure to light is cut and discharged from the processing route of the photosensitive medium before the development process; a first sheet of the photosensitive medium is cut in a predetermined size, including a leading end portion that gets fogged due to exposure to light, the part of this sheet which has not become fogged being exposed to a test pattern; or a first sheet of the photosensitive medium is cut in a size determined by summing the size of a leading end portion that gets fogged due to exposure to light and the size of a predetermined area of exposure.

2 Claims, 2 Drawing Sheets

METHOD OF DISPOSING OF END OF PHOTOSENSITIVE MEDIUM

BACKGROUND OF THE INVENTION

This invention relates to a method of disposing of the leading end of a roll of photosensitive medium when unrolled and exposed to an original image in an image-forming apparatus.

The type of image-forming apparatus in which a roll of photosensitive medium is unrolled and exposed to an original image is advantageous in that a photosensitive medium of one size which is loaded in the apparatus can be used by being cut into photosensitive medium sheets of a plurality of different sizes. The leading end of the photosensitive medium is set to project from the roll so that the photosensitive medium can be unrolled. Since the roll of photosensitive medium is usually loaded in a bright room, the projecting portion is fogged due to exposure to light, and this portion must be removed. Therefore, according to conventional methods, only the fogged portion is cut off, or a part of the photosensitive medium sheet which includes the fogged portion and has a size corresponding to the area of exposure to the original image is cut and is thereafter removed as waste after the step of processing the photosensitive medium. In the former case, there is a strong possibility the cut portion will clog the apparatus due to its size being smaller than any of the desired sizes. In the latter case, there is a certain amount of waste caused by removing even that portion which has not undergone exposure.

SUMMARY OF THE INVENTION

The present invention has been achieved in consideration of the above-described circumstances, and an object of the present invention is to provide a method of disposing of the leading end of a roll of photosensitive medium which allows a leading end portion of the photosensitive medium that gets fogged due to exposure to light to be removed and which does not cause any waste of or clogging by of the photosensitive medium.

Another object of the present invention is to provide a method of disposing of the leading end of a roll of photosensitive medium which allows a first sheet of the photosensitive medium to be cut in a predetermined size, including a leading end portion that gets fogged due to exposure to light, and effectively makes use of the part of this sheet which is not fogged without causing any waste of or clogging by the photosensitive medium.

Still another object of the present invention is to provide a method of disposing of the leading end of a roll of photosensitive medium which allows a first sheet of the photosensitive medium to be cut in a size determined by summing the size of a leading end portion that gets fogged due to exposure to light and the size of a predetermined area of exposure, and which is free from any possibility of clogging during transportation of under-sized photosensitive medium sheets to a processing section.

The present invention provides in one of its aspects a method of disposing of the leading end of a roll of photosensitive medium which allows a fogged leading end portion of the photosensitive medium that has become fogged due to exposure to light to be cut off and discharges the portion thereby cut off from the processing route of the photosensitive medium before the development process.

The present invention provides in another of its aspects a method of disposing of the leading end of a roll of photosensitive medium which allows a first sheet of the photosensitive medium to be cut off in a predetermined size including a leading end portion that has become fogged due to exposure to light and exposes a part of the first sheet which has not become fogged to a test pattern.

The present invention provides in still another of its aspects a method of disposing of the leading end of a roll of photosensitive medium which allows a first sheet of the photosensitive medium to be cut off in a size determined by summing the size of a leading end portion that has become fogged by light and the size of a predetermined area of exposure.

DESCRIPTION OF THE PREFERRED EMBODIMENTS

Figure 1:
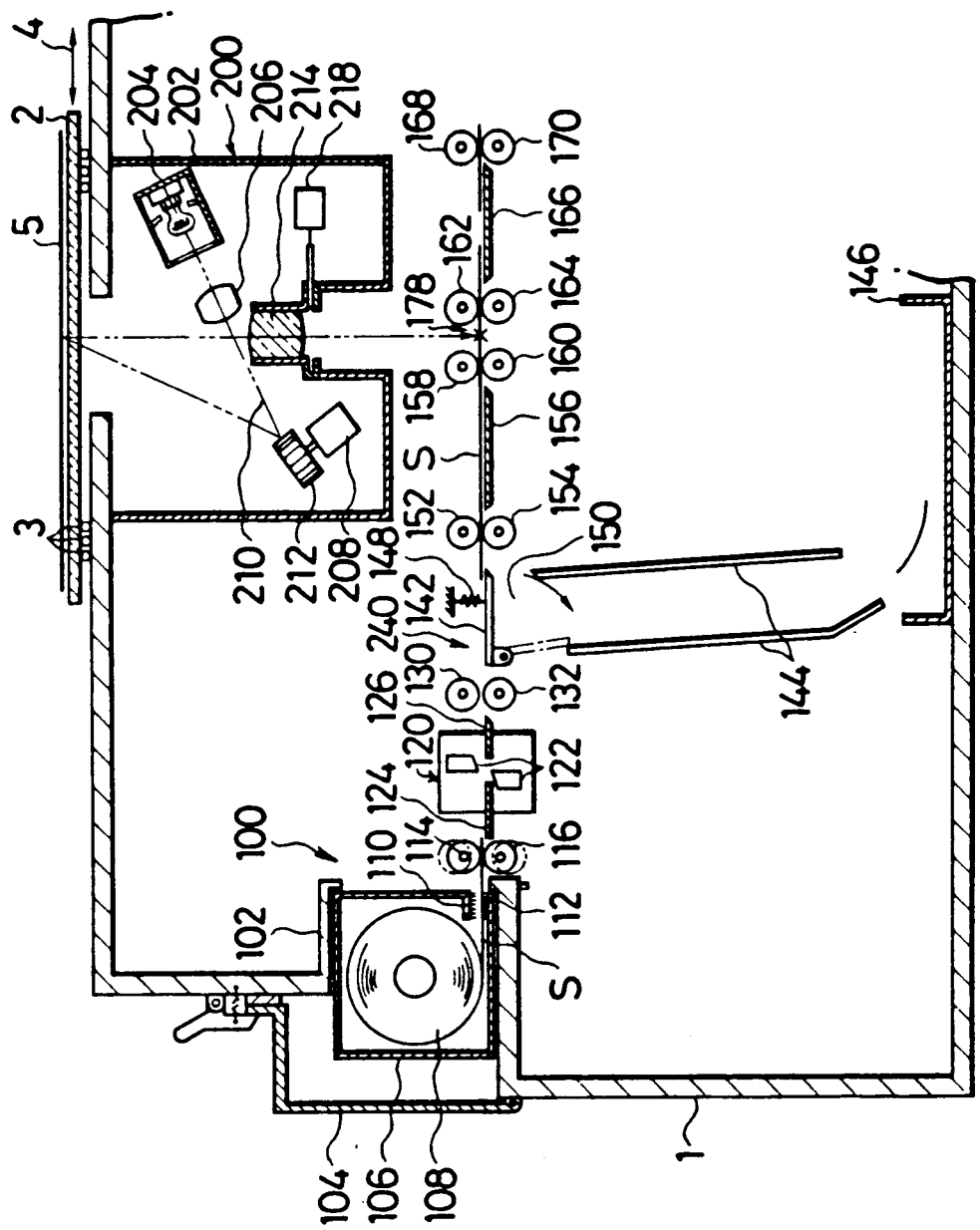
FIG. 1 is a cross-sectional view of a photosensitive medium supplying device and an imaging optical system in an image recording apparatus in accordance with a first embodiment of the present invention.

The present invention will be described below with respect to the preferred embodiments thereof with reference to the accompanying drawings. FIG. 1 shows a cross-sectional view of an image recording apparatus to which a method which represents a first embodiment of the present invention has been applied. As shown in FIG. 1, an original supporting glass plate 2 on which an original 5 is placed so as to face downward is mounted on the upper surface of a housing 1 in such a manner that it can slide in the direction indicated by the arrows 4 while being supported by rollers 3. Under the glass plate 2 is provided an imaging optical system 200 which is disposed in an exposure housing 202. A photosensitive medium supplying device 100 is disposed by the side of the exposure housing 202.

The photosensitive medium supplying device 100 is constructed such that a photosensitive medium cartridge 106 which accommodates a roll of photosensitive medium S is detachably mounted in a recess 102 formed in a side wall of the housing 1. The recess 102 is covered by a lid member 104 so as to provide shade. An outlet slit through which the photosensitive medium S which is unrolled from a photosensitive medium roll 108 passes and which is provided with a resilient shading member 110 is formed in a lower portion of the photosensitive medium cartridge 106. A pair of feeding rollers 114 and 116 are disposed in front of the outlet slit 112 (it is assumed here that "in front of" means "downstream" relative to the direction of transportation of the photosensitive medium S), and a cutter unit 120 is disposed in front of the feeding rollers 114 and 116. The cutter unit 120 has a transportation counter (not shown) and guide plates 124 and 126 which are disposed in front of and at the rear of a pair of cutters 122, respectively.

A pair of nip rollers 130 and 132 are disposed in front of the cutter unit 120, and a leading end discharging device 240 is disposed in front of the nip rollers 130 and 132. The leading end discharging device 240 consists of a discharging gate 142, vertical guide tube 144 and a discharge tray 146. The discharge gate 142 is normally set to be horizontal by virtue of the force of a tension spring 148 so as to form a transportation passage for the photosensitive medium S. At the time of discharge of the leading end, the gate 142 is set to be vertical so as to form a discharge outlet 150 under the control of a discharge control device (not shown), as indicated by the dashed line in FIG. 1.

In front of the leading end discharging device 240, a pair of nip rollers 152 and 154, a guide plate 156, a pair of nip rollers 158 and 160, a pair of nip rollers 162 and 164, a guide plate 166 and a pair of nip rollers 168 and 170 are disposed in that order. The pair of nip rollers 158 and 160 and the pair of nip rollers 162 and 164 are disposed so as to be comparatively close to each other. An exposure section 178 of the imaging optical system 200 is defined between these pairs of rollers.

In the imaging optical system 200, illumination light 210 generated by a light source lamp 204 and a condenser lens 206 is oscillated by a polygon mirror 212 which is rotated by a motor 208, thereby scanning the original 5. An image obtained by scanning the original 5 is formed at the exposure section 178. A shutter 218 which opens only during the time of exposure is disposed below an imaging lens 214.

A well-known type of development device and fixing device are disposed in front of the pair of nip rollers 168 and 170. These devices are not shown in the drawing and will not be described here.

In the operation of the above-described apparatus, the photosensitive medium cartridge 106 is first loaded with the photosensitive medium roll 108. At this time, the leading end of the photosensitive medium S is made to project from the outlet slit 112 so that the photosensitive medium S can be unrolled. The photosensitive medium cartridge 106 loaded with the photosensitive medium roll 108 is inserted into the recess 102 by opening the lid member 104. The pair of feeding rollers 114 and 116 are moved away from each other, as indicated by the chain double-dashed line in FIG. 1, so as to facilitate the transportation of the photosensitive medium S when the leading end of the photosensitive medium S is transported.

When the transportation counter counts a predetermined distance of movement which corresponds to the portion of the photosensitive medium S that has become fogged due to exposure to light, the cutter unit 120 cuts the photosensitive medium S, and the discharge control device opens the discharge gate 142. The leading end of the photosensitive medium S which includes the fogged portion and which has been cut off is transported by the pair of nip rollers 130 and 132 and is then thrown into the discharge tray 146 through the discharge outlet 150 and the vertical guide plate 144.

The discharge gate 142 is thereafter returned to the horizontal state, and a portion of the photosensitive medium which has not become fogged is transported by the pair of feeding rollers 114 and 116, is cut by the cutter unit 120 at the desired length and is transported to the exposure section 178. In the imaging optical system 200, the light source lamp 204 is lit; the polygon mirror 212 rotates so that the original 5 is scanned by the illumination light 210, and the image of the original 5 is formed at the exposure section 178 by the imaging lens 214, thereby effecting exposure of the image.

The roll of photosensitive medium S may be of a type which has previously been loaded in the photosensitive cartridge 106 in the factory, a type which is wound around a roll member with flanges, or a type of roll formed of a photosensitive material sheet and a shading sheet with one on top of the other.

The photosensitive medium may be formed from a known silver-salt photosensitive material such as is used to make prints in ordinary photography, or from a photo- and pressure-sensitive heat-developable material as disclosed in the specification of Japanese Patent Public Disclosure No. 278849/1986 filed by the present applicant.

In this embodiment, only the leading end portion of a photosensitive medium which has become fogged due to exposure to light is cut off and removed before the development process so as to prevent any piece of photosensitive medium having a size smaller than any of the desired sizes from being transported through the overall process. This embodiment therefore realizes a method of disposing of the leading end of a photosensitive medium which enables the possibility of clogging by the leading end portion which has been cut off to be reduced as compared with conventional arrangements and which reduces the amount of waste caused by cutting off and disposing of even that portion of the photosensitive medium which is not fogged due to exposure to light.

Figure 2:
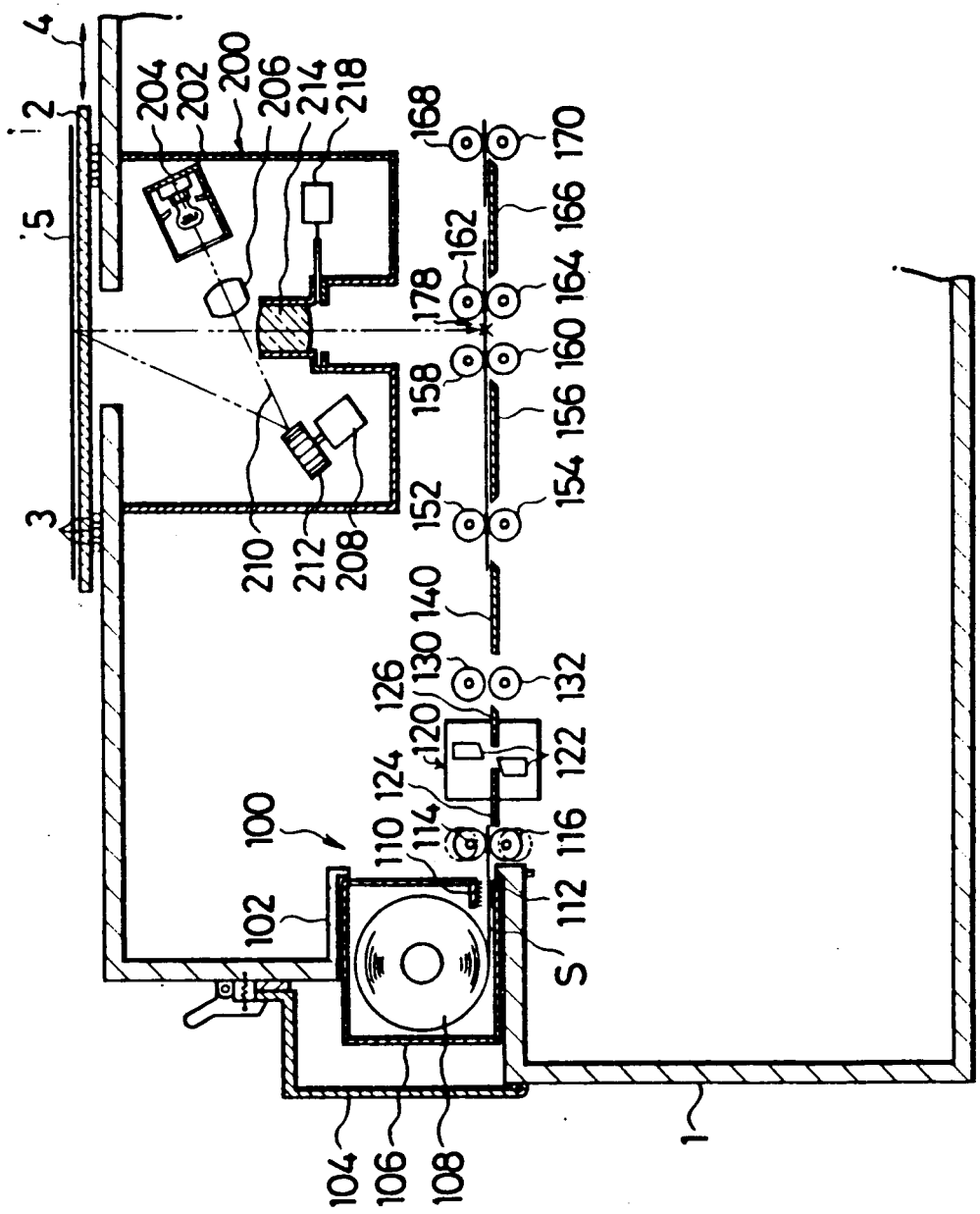
FIG. 2 is a cross-sectional view of a photosensitive medium supplying and an imaging optical system in an image recording apparatus in accordance with a second embodiment of the present invention.

A second embodiment of the present invention will be described below with reference to FIG. 2. FIG. 2 shows a cross-sectional view of an image-recording apparatus to which a method which represents the second embodiment has been applied. As shown in FIG. 2, an original supporting glass plate 2 on which an original 5 is placed so as to face downward is mounted on the upper surface of a housing 1 in such a manner that it can slide in the direction indicated by the arrows 4 while being supported by rollers 3. Under the glass plate 2 is provided an imaging optical system 200 which is disposed in an exposure housing 202. A photosensitive medium supplying device 100 is disposed by the side of the exposure housing 202.

The photosensitive medium supplying device 100 is constructed so that a photosensitive medium cartridge 106 which accommodates a roll of photosensitive medium S is detachably mounted in a recess 102 formed in a side wall of the housing 1. The recess 102 is covered by a lid member 104 so as to provide shade. An outlet slit 112 through which the photosensitive medium S which is unrolled from a photosensitive medium roll 108 passes and which is provided with a resilient shading member 110 is formed in a lower portion of the photosensitive medium cartridge 106. A pair of feeding rollers 114 and 116 are disposed in front of the outlet slit 112 (it is assumed here that "in front of" means "downstream" relative to the direction of transportation of the photosensitive medium S), and a cutter unit 120 is disposed in front of the feeding rollers 114 and 116. The cutter unit 120 has a transportation counter (not shown) and guide plates 124 and 126 which are disposed, respectively, in front of and at the rear of a pair of cutters 122.

In front of the cutter unit 120, a pair of nip rollers 130 and 132, a guide plate 140, a pair of nip rollers 152 and 154, a guide plate 156, a pair of nip rollers 158 and 160, a pair of nip rollers 162 and 164, a guide plate 166 and a pair of nip rollers 168 and 170 are disposed in that order. The pair of nip rollers 158 and 160 and the pair of nip rollers 162 and 164 are disposed so as to be comparatively close to each other. An exposure section 178 of the imaging optical system 200 is defined between these pairs of rollers.

In the imaging optical system 200, illumination light 210 generated by a light source lamp 204 and a condenser lens 206 is oscillated by a polygon mirror 212 which is rotated by a motor 208, thereby scanning the original 5. An image obtained by scanning the original 5 is formed at the exposure section 178. A shutter 218 which opens only during the time of exposure is disposed below an imaging lens 214.

A well-known type of development device and fixing device are disposed in front of the pair of nip rollers 168 and 170. These devices are not shown in the drawing and will not be described here.

In the operation of the above-described apparatus, the photosensitive medium cartridge 106 is first loaded with the photosensitive medium roll 108. At this time, the leading end of the photosensitive medium S is made to project from the outlet slit 112 so that the photosensitive medium S can be unrolled. The photosensitive medium cartridge 106 loaded with the photosensitive medium roll 108 is inserted into the recess 102 by opening the lid member 104. The pair of feeding rollers 114 and 116 are moved away from each other, as indicated by the double-dashed line in FIG. 2, so as to facilitate the transportation of the photosensitive medium S when the leading end of the photosensitive medium S is transported.

When the transportation counter measures transportation of a photosensitive material sheet of a predetermined exposure size, the cutter unit 120 cuts the photosensitive medium S. The photosensitive medium sheet which has been cut by the cutter unit 120 in the predetermined size is transported to the exposure section 178. In the imaging optical system 200, the light source lamp 204 is lit, the polygon mirror 212 rotates so that the original 5 having a test pattern is scanned by the illumination light 210, and the image of the original 5 is formed at the exposure section 178 by the imaging lens 214, thereby effecting exposure of the image.

The exposed photosensitive medium sheet thus obtained undergoes the process of development and fixing and is thereafter used as a reference for setting the exposure conditions under which the next photosensitive sheet is exposed. From this time forwards, the photosensitive medium supplying device 100 and the imaging optical system 200 start ordinary operations and effect ordinary image formation.

In this embodiment, the complete length of the photosensitive medium S including the leading end thereof has been assumed to be formed from the same material, but the leading end of the photosensitive medium may be formed from a different material of lower cost.

The roll of photosensitive medium S may be of a type which has previously been loaded in the photosensitive cartridge 106 in the factory, a type which is wound around a roll member with flanges, or a type of roll formed of a photosensitive material sheet and a shading sheet one on top of the other.

The photosensitive medium may be formed from a known silver-salt photosensitive material such as is used to make prints in ordinary photography, or from a photo- and pressure-sensitive heat-developable material as disclosed in the specification of Japanese Patent Public Disclosure No. 278849/1986 filed by the present applicant.

In this embodiment, any piece of the photosensitive medium having a size smaller than the predetermined size is prevented from being transported to the processing sections. The present invention therefore realizes a method of disposing of the leading end of a photosensitive medium which enables the possibility of clogging by photosensitive medium sheets to be reduced as compared with conventional methods and which reduces the amount of waste caused by cutting off and disposing of even that portion of the photosensitive medium which is not fogged due to exposure to light.

A third embodiment of the present invention will be described below with reference to the second embodiment.

In the image-forming apparatus of the third embodiment, when the transportation counter measures transportation of a photosensitive material sheet having a predetermined length corresponding to the sum of the size of the leading end portion which has become fogged due to exposure to light and the exposure size of a photosensitive medium sheet, the cutter unit 120 cuts the photosensitive medium S. The photosensitive medium sheet which has been cut by the cutter unit 120 in the predetermined size is transported to the exposure section 178. In the imaging optical system 200, the light source lamp 204 is lit, the polygon mirror 212 rotates so that the original 5 is scanned by the illumination light 210, and the image of the original 5 is formed at the exposure section 178 by the imaging lens 214, thereby effecting exposure of the image.

The exposed photosensitive medium sheet thus obtained undergoes the process of development and fixing and is thereafter used as a reference for setting the exposure conditions under which the next photosensitive sheet is exposed. From this time forwards, the photosensitive medium supplying device 100 and the imaging optical system 200 start ordinary operations and effect ordinary image formation.

The invention has thus been shown and described with reference to specific embodiments, however, it should be noted that the invention is in no way limited to the details of the illustrated structures and changes and modifications may be made which do not depart from the scope of the appended claims.

We claim:

1. In an image forming apparatus including, in succession, a photosensitive material supply station (100), a cutting station (120), an optical exposing station (200), and developing and fixing stations, and means for conveying a web or sheet of photosensitive material successively from the supply station and through the remaining stations, wherein the photosensitive material is supplied as an elongate web from a roll (108) mounted in an opaque cartridge (106) having a withdrawal slit (112) through which a leader portion projects to enable its engagement by the conveying means, said leader portion being fogged by exposure to light and having a length shorter than that of an image print produced by the apparatus, a method of disposing of the fogged leader portion, comprising:
 a) severing an image print length of the photosensitive material including the shorter length fogged leader portion,
 b) exposing an unfogged portion of the severed length of the material to a test pattern,
 c) developing and fixing the exposed length to form an image of the test pattern, and
 d) adjusting the exposure conditions of the optical exposing station using the formed test pattern image as a reference.

2. In an image forming apparatus including, in succession, a photosensitive material supply station (100), a cutting station (120), an optical exposing station (200), and developing and fixing stations, and means for conveying a web or sheet of photosensitive material successively from the supply station and through the remaining stations, wherein the photosensitive material is supplied as an elongate web from a roll (108) mounted in an opaque cartridge (106) having a withdrawal slit (112) through which a leader portion projects to enable its engagement by the conveying means, said leader portion being fogged by exposure to light and having a length shorter than that of an image print produced by the apparatus, a method of disposing of the fogged leader portion, comprising:

a) severing an increased length of the photosensitive material including the shorter length fogged leader portion and an image print length, b) exposing the image print portion of the severed length of the material to an original, c) developing and fixing the exposed image print portion of the severed length to form an image of the original, and d) adjusting the exposure conditions of the optical exposing station using the formed original image as a reference.

* * * * *